United States Patent
Kang et al.

(10) Patent No.: US 9,312,512 B2
(45) Date of Patent: Apr. 12, 2016

(54) FLEXIBLE ORGANIC LIGHT-EMITTING DISPLAY APPARATUS AND METHOD OF MANUFACTURING THE SAME

(71) Applicant: Samsung Display Co., Ltd., Yongin, Gyeonggi-do (KR)

(72) Inventors: Dong-Hun Kang, Yongin (KR); Oh-June Kwon, Yongin (KR); Young-Seo Choi, Yongin (KR); Dong-Won Han, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/275,829

(22) Filed: May 12, 2014

(65) Prior Publication Data

US 2015/0188079 A1   Jul. 2, 2015

(30) Foreign Application Priority Data

Jan. 2, 2014  (KR) .................. 10-2014-0000406

(51) Int. Cl.
  *H01L 51/56*  (2006.01)
  *H01L 51/00*  (2006.01)
  *H01L 51/52*  (2006.01)

(52) U.S. Cl.
  CPC ........ *H01L 51/5253* (2013.01); *H01L 51/5259* (2013.01); *H01L 51/0097* (2013.01)

(58) Field of Classification Search
  CPC .................. H01L 51/52; H05B 33/12
  USPC .................. 257/40; 438/28; 313/504; 445/58
  See application file for complete search history.

(56) References Cited

U.S. PATENT DOCUMENTS

| | | | |
|---|---|---|---|
| RE40,787 E * | 6/2009 | Martin et al. | 428/412 |
| 2005/0051763 A1 * | 3/2005 | Affinito et al. | 257/3 |
| 2007/0281174 A1 * | 12/2007 | Moro | C23C 14/024 428/447 |
| 2012/0305981 A1 * | 12/2012 | Park et al. | 257/100 |
| 2013/0181602 A1 * | 7/2013 | Kang et al. | 313/504 |
| 2013/0188324 A1 | 7/2013 | Lee et al. | |

FOREIGN PATENT DOCUMENTS

| | | |
|---|---|---|
| JP | 2003-086352 A | 3/2003 |
| JP | 2005-342898 A | 12/2005 |
| KR | 10-2013-0084127 A | 7/2013 |

* cited by examiner

*Primary Examiner* — Cuong Q Nguyen
*Assistant Examiner* — Tong-Ho Kim
(74) *Attorney, Agent, or Firm* — Lewis Roca Rothgerber Christie LLP

(57) ABSTRACT

A flexible organic light-emitting display apparatus includes a flexible substrate, a barrier layer on the flexible substrate, a display portion on the barrier layer, an encapsulation layer covering the display portion, and a porous layer between the flexible substrate and the display portion.

8 Claims, 6 Drawing Sheets

FLEXIBLE ORGANIC LIGHT-EMITTING DISPLAY APPARATUS AND METHOD OF MANUFACTURING THE SAME

CROSS-REFERENCE TO RELATED APPLICATION

This application claims priority to and the benefit of Korean Patent Application No. 10-2014-0000406, filed on Jan. 2, 2014, in the Korean Intellectual Property Office, the disclosure of which is incorporated herein by reference in its entirety.

BACKGROUND

1. Field

Aspects of embodiments of the present invention relate to flexible organic light-emitting display apparatuses that are flexibly modifiable and methods of manufacturing the flexible organic light-emitting display apparatuses.

2. Description of the Related Art

In general, a flexible display apparatus is an apparatus with flexibility added to a display portion that is formed on a flexible substrate such as a polyimide substrate. The flexible display apparatus is very convenient because a volume of the flexible display apparatus carried by a user is reduced by modifying a shape thereof.

SUMMARY

Aspects of embodiments of the present invention are directed to flexible organic light-emitting display apparatuses and methods of manufacturing the flexible organic light-emitting display apparatuses.

Additional aspects will be set forth in part in the description which follows and, in part, will be apparent to those having ordinary skill in the art from the description, or may be learned by practice of the described embodiments.

According to one or more embodiments of the present invention, a flexible organic light-emitting display apparatus includes: a flexible substrate; a barrier layer on the flexible substrate; a display portion on the barrier layer; an encapsulation layer covering the display portion; and a porous layer between the flexible substrate and the display portion.

The porous layer may include an LiF material.

The porous layer may be between the flexible substrate and the barrier layer.

The flexible substrate may include a plurality of flexible substrates and the barrier layer may include a plurality of barrier layers, where the plurality of flexible substrates and the plurality of barrier layers may be alternately stacked. The porous layer may be between a first flexible substrate of the plurality of flexible substrates and a first barrier layer of the plurality of barrier layers. The first flexible substrate may be the closest to the display portion from among the plurality of substrates and the first barrier layer may be the closest to the display portion from among the plurality of barrier layers.

The porous layer may be between the barrier layer and the display portion.

The flexible substrate may include a plurality of flexible substrates and the barrier layer may include a plurality of barrier layers, where the plurality of flexible substrates and the plurality of barrier layers may be alternately stacked. The porous layer may be between a first barrier layer closest to the display portion from among the plurality of barrier layers and the display portion.

The flexible organic light-emitting display apparatus may further include an AlOx layer between the flexible substrate and the display portion.

According to one or more embodiments of the present invention, a method of manufacturing a flexible organic light-emitting display apparatus includes: forming a flexible substrate on a carrier substrate; forming a barrier layer on the flexible substrate; forming a display portion on the barrier layer; covering the display portion with an encapsulation layer; and forming a porous layer between the flexible substrate and the display portion.

The porous layer may include an LiF material.

The porous layer may be formed between the flexible substrate and the barrier layer.

The flexible substrate may include a plurality of flexible substrates and the barrier layer may include a plurality of barrier layers, where the plurality of flexible substrates and the plurality of barrier layers may be alternately stacked. The porous layer may be formed between a first flexible substrate of the plurality of flexible substrates and a first barrier layer of the plurality of barrier layers. The first flexible substrate may be the closest to the display portion from among the plurality of substrates and the first barrier layer may be the closest to the display portion from among the plurality of barrier layers.

The porous layer may be formed between the barrier layer and the display portion.

The flexible substrate may include a plurality of flexible substrates and the barrier layer may include a plurality of barrier layers, where the plurality of flexible substrates and the plurality of barrier layers may be alternately stacked. The porous layer may be formed between a first barrier layer closest to the display portion from among the plurality of barrier layers and the display portion.

The method may further include forming an AlOx layer between the flexible substrate and the display portion.

BRIEF DESCRIPTION OF THE DRAWINGS

Aspects of embodiments of the present invention will become apparent and appreciated by those having ordinary skill in the art from the following description of the embodiments, taken in conjunction with the accompanying drawings in which.

DETAILED DESCRIPTION

Figure 1:
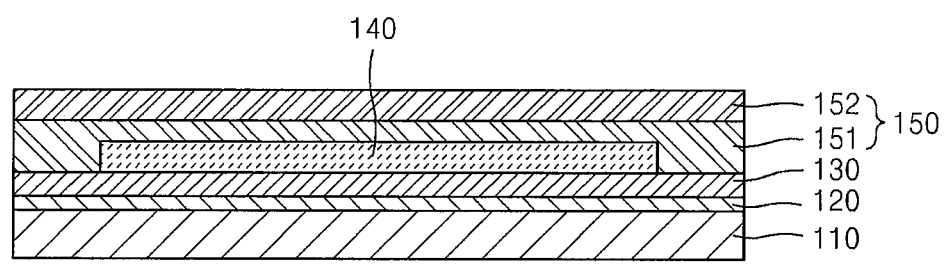
FIG. 1 is a cross-sectional view of a flexible organic light-emitting display apparatus, according to an embodiment of the present invention.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of illustration. In other words, since sizes and thicknesses of components in the drawings are arbitrarily illustrated for the convenience of illustration, the following embodiments are not limited thereto.

When a certain embodiment may be implemented differently, a specific process order may be performed differently from the described order. For example, two consecutively described processes may be performed at substantially the same time or performed in an order that is the same or opposite to the described order.

FIG. 1 is a cross-sectional view of a flexible organic light-emitting display apparatus, according to an embodiment of the present invention. The flexible organic light-emitting display apparatus according to an embodiment as shown in FIG. 1 includes a stack structure of a flexible substrate 110 formed of a polyimide material, a barrier layer 130, a display portion 140 including a thin film transistor (TFT) and an emission layer, and a thin film encapsulation layer 150 in which organic layers 151 and inorganic layers 152 are alternately disposed. That is, a structure in which the display portion 140 is sealed by using the flexible substrate 110 and the thin film encapsulation layer 150 is implemented instead of a thick and hard glass substrate. Thus, the flexible organic light-emitting display apparatus may be flexibly modified.

A porous layer 120 may be formed between the flexible substrate 110 and the barrier layer 130. The porous layer 120 may be formed of a lithium fluoride (LiF) material, and may be formed between the flexible substrate 110 and the barrier layer 130 through deposition or coating. The porous layer 120 may substantially prevent gas generated during a manufacturing process from permeating to the display portion 140. That is, the emission layer included in the display portion 140 of the flexible organic light-emitting display apparatus may be vulnerable to contact with gas, in particular oxygen, such that the emission layer may be damaged when the gas permeates into the emission layer. When the emission layer is damaged, a damaged region of the emission layer may not properly emit light, and accordingly an entire product may become substantially defective. However, when the porous layer 120 is formed between the flexible substrate 110 and the display portion 140 as shown in FIG. 1, even when the gas permeates into the emission layer, because the gas is collected in the porous layer 120, the display portion 140 may be safely secured. The gas that may damage the display portion 140 may be generated when the barrier layer 130 is formed on the flexible substrate 110. That is, the barrier layer 130 is formed through chemical vapor deposition (CVD). In this regard, the gas is generated when the flexible substrate 110 is damaged by plasma. There is no problem if the gas does not permeate into the display portion 140. However, if the gas permeates into the display portion 140, the emission layer may be damaged as described above, which may cause a defective pixel. Thus, the porous layer 120 may be provided between the flexible substrate 110 and the display portion 140 to prevent the gas from spreading to the inside of the display portion 140.

Meanwhile, the flexible substrate 110 may be formed of heat resistant polyimide having a glass conduction temperature of 500° C. or higher. The flexible substrate 110 is a flexible thin film substrate that replaces a given general glass substrate.

The barrier layer 130 is a water proof layer that substantially prevents moisture from permeating from the outside, and may be configured as, for example, a silicon oxide/silicon nitride (SiO/SiN) multilayer. The barrier layer 130 may be a layer of a multilayer structure in which SiO and SiN are stacked, and may have a water vapor transmission rate of $10^{-3}$ $g/m^2 \cdot day$ or lower. The display portion 140 may be vulnerable to permeation of moisture as well as gas, and thus, the porous layer 120 acts to collect gas, and the barrier layer 130 acts to substantially prevent moisture from permeating from the outside.

Figure 2:
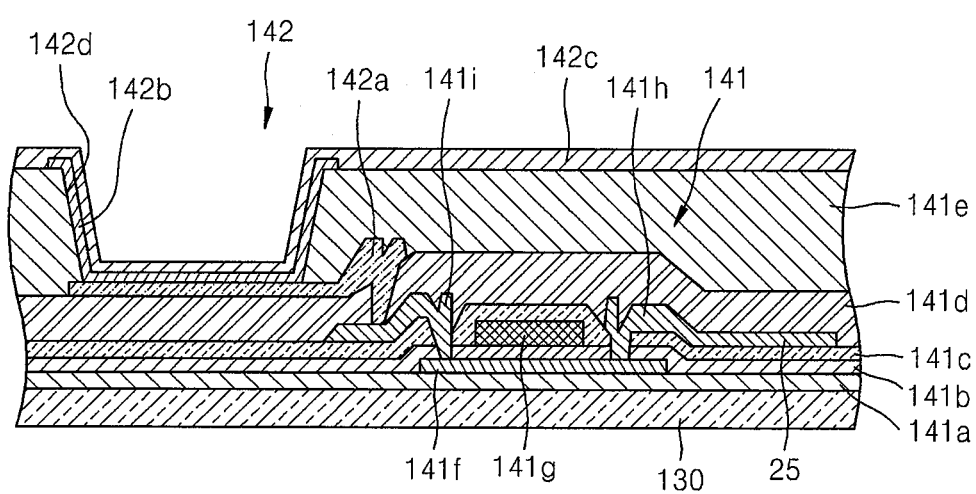
FIG. 2 is an enlarged cross-sectional view of a display portion of the flexible organic light-emitting display apparatus shown in FIG. 1.

The display portion 140 may be configured as shown in FIG. 2. As shown in FIG. 2, the display portion 140 includes a TFT 141 and an electroluminescence (EL) device 142. The EL device 142 includes an emission layer 142b that may be substantially vulnerable to, in particular, contact with gas. In more detail, a semiconductor active layer 141f is formed on a buffer layer 141a adjacent to the barrier layer 130. The semiconductor active layer 141f includes source and drain regions doped with N or P type impurities at high concentration. The semiconductor active layer 141f may be formed of an oxide semiconductor. For example, the oxide semiconductor may include an oxide of a material selected from Group 12, 13, or 14 metal elements, such as zinc (Zn), indium (In), gallium (Ga), tin (Sn), cadmium (Cd), germanium (Ge), or hafnium (Hf), and any combinations thereof. For example, the semiconductor active layer 141f may include G-I-Z-O [$(In_2O_3)a(Ga_2O_3)b(ZnO)c$], a, b, and c are real numbers satisfying a condition that a≥0, b≥0, c>0). A gate electrode 141g is formed on the active layer 141f with a gate insulating layer 141b disposed between the gate electrode 141g and the active layer 141f. A source electrode 141h and a drain electrode 141i are formed on the gate electrode 141g. An interlayer insulating layer 141c is provided between the gate electrode 141g and the source and drain electrodes 141h and 141i. A passivation layer 141d is provided between the source and drain electrodes 141h and 141i and an anode electrode 142a of the EL device 142. An insulating planarization layer 141e formed of acryl is formed on the anode electrode 142a. An opening 142d is formed in the insulating planarization layer 141e, and thus, the EL device 142 is formed.

The EL device 142 emits red, green, or blue light according to a flow of current, and displays image information (e.g., predetermined image information). The EL device 142 includes the anode electrode 142a, a cathode electrode 142c, and the emission layer 142b interposed between the anode electrode 142a and the cathode electrode 142c. The anode electrode 142a is coupled (e.g., connected) to the drain electrode 141i of the TFT 141, and receives a positive power supply from the drain electrode 141i. The cathode electrode 142c is configured to cover whole pixels, and supplies a negative power. The emission layer 142b is configured to emit light.

A hole injection layer (HIL), a hole transport layer (HTL), an emission layer (EML), an electron transport layer (ETL), and an electron injection layer (EIL) may be stacked adjacent to the emission layer 142b.

The emission layer 142b may be separately formed for each pixel so that pixels that respectively emit red, green, and blue light form a single unit pixel. Alternatively, the emission layer 142b may be commonly formed on a whole pixel region irrespective of positions of pixels. In this regard, the emission layer 142b may be formed by vertically stacking or mixing, for example, layers including emission materials that respectively emit the red, green, and blue light. A combination of other colors may be possible if the emission layer 142b is able to emit white light. A color conversion layer that converts the emitted white light into a color (e.g., a predetermined color), or a color filter may be further included.

The emission layer 142b may be highly vulnerable to contact with gas, and thus, if gas permeates into the display portion 140, a problem may occur that an image forming characteristic of the flexible organic light-emitting display apparatus may quickly deteriorate.

The thin film encapsulation layer 150 formed on the display portion 140 is a layer covering and protecting the display portion 140, and has a structure in which the organic layers 151 and the inorganic layers 152 are alternately stacked.

The flexible organic light-emitting display apparatus of the above-described structure may be manufactured through the below process.

Figure 3A:
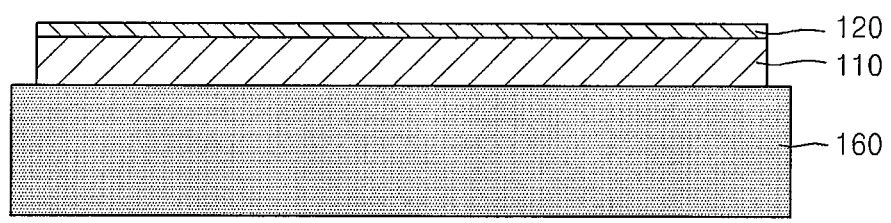
FIGS. 3A through 3C are cross-sectional views illustrating a method of manufacturing the flexible organic light-emitting display apparatus shown in FIG. 1, according to an embodiment of the present invention.

As shown in FIG. 3A, a carrier substrate 160 formed of a glass material is prepared, and then thin film layers are formed thereon.

The flexible substrate 110 formed of a polyimide material is formed on the carrier substrate 160, and then the porous layer 120 formed of a LiF material is formed thereon.

Figure 3B:
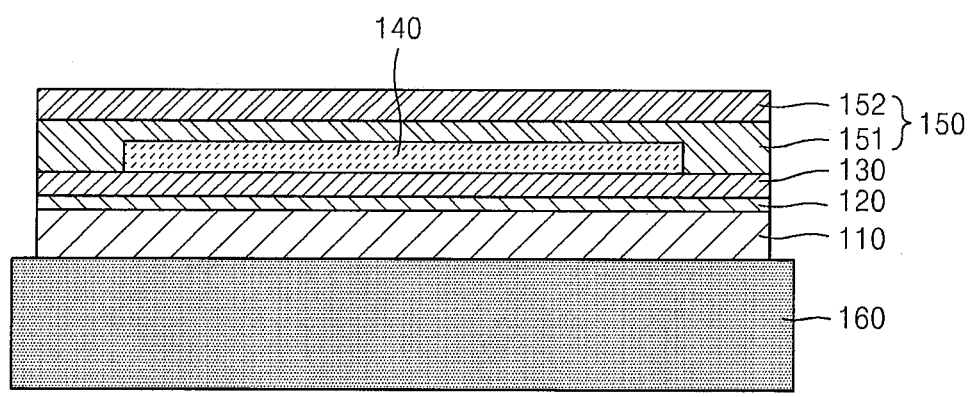

Thereafter, as shown in FIG. 3B, the barrier layer 130, the display portion 140, and the thin film encapsulation layer 150 are sequentially formed.

Figure 3C:
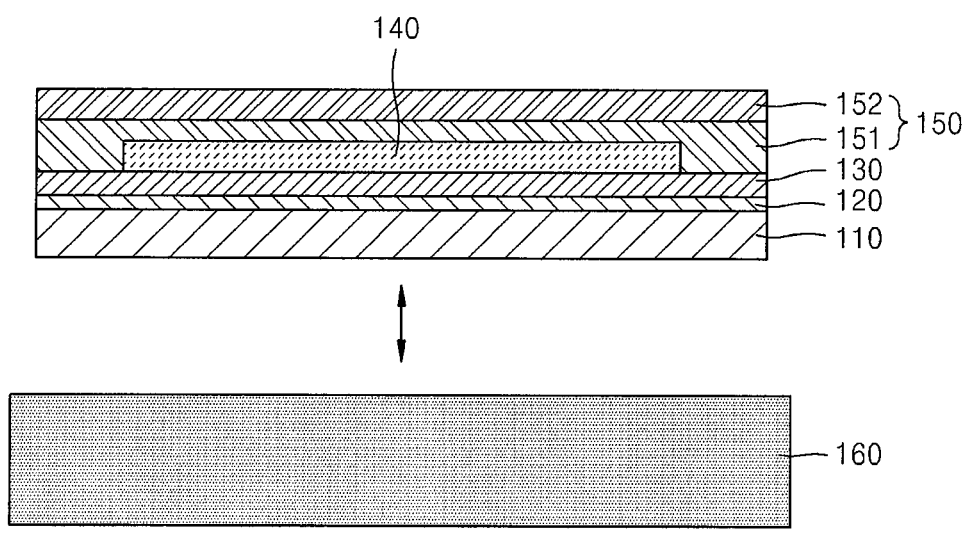

When a stack structure is completed through the above-described process, the carrier substrate 160 is separated as shown in FIG. 3C.

The flexible organic light-emitting display apparatus manufactured with the above-described process may be flexible since the flexible substrate 110 and the thin film encapsulation layer 150 surround the display portion 140. Further, the flexible organic light-emitting display apparatus may substantially protect the display portion 140 from deterioration causing gas since the porous layer 120 collects the gas permeating into the inside of the organic light-emitting display apparatus.

Figure 4:
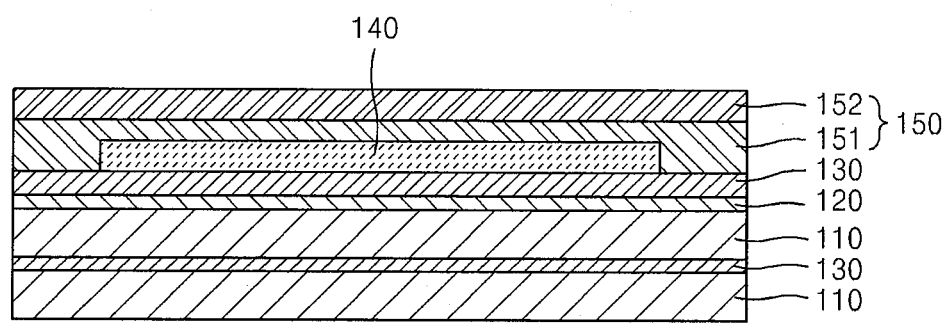
FIGS. 4 through 10 are cross-sectional views of a flexible organic light-emitting display apparatus, according to other embodiments of the present invention.

A structure in which the flexible substrate 110 and the barrier layer 130 are alternately disposed is shown in the above-described embodiment, however, embodiments of the present invention are not limited thereto. For example, in another embodiment shown in FIG. 4, the structure may be modified such that a plurality of flexible substrates 110 and a plurality of barrier layers 130 are alternately disposed, and the porous layer 120 is disposed between the flexible substrate 110 and the barrier layer 130 that are closest to the display portion 140.

Figure 5:
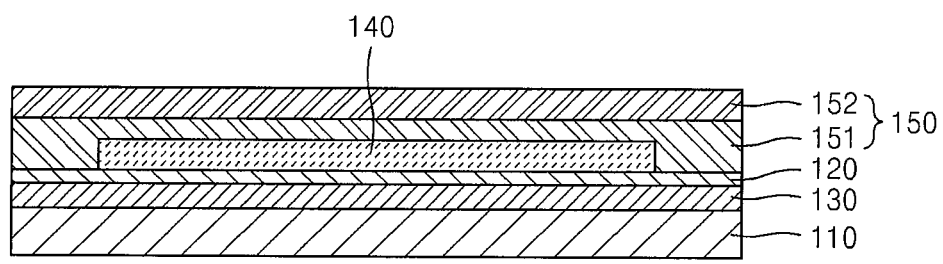

The porous layer 120 may be formed between the flexible substrate 110 and the barrier layer 130 in the above-described embodiments, but embodiments of the present invention are not limited thereto. For example, at least one layer may be formed on an optional layer between the flexible substrate 110 and the display portion 140. That is, as shown in FIG. 5, the porous layer 120 may be formed between the barrier layer 130 and the display portion 140, instead of between the flexible substrate 110 and the barrier layer 130.

Figure 6:
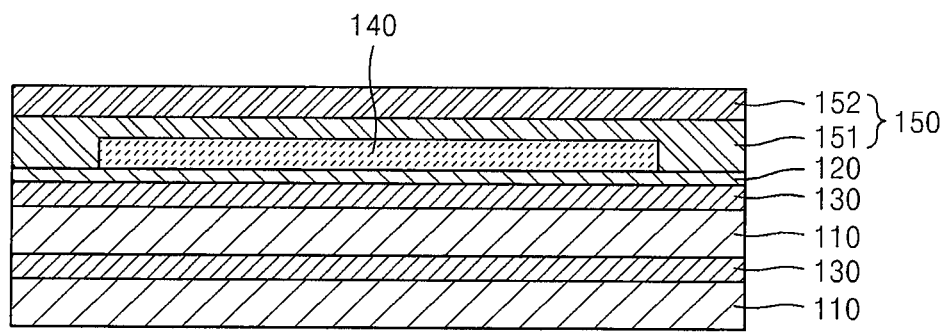
Figure 7:
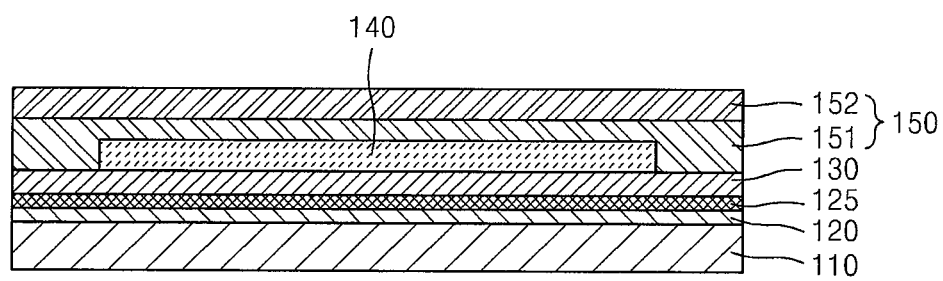
Figure 8:
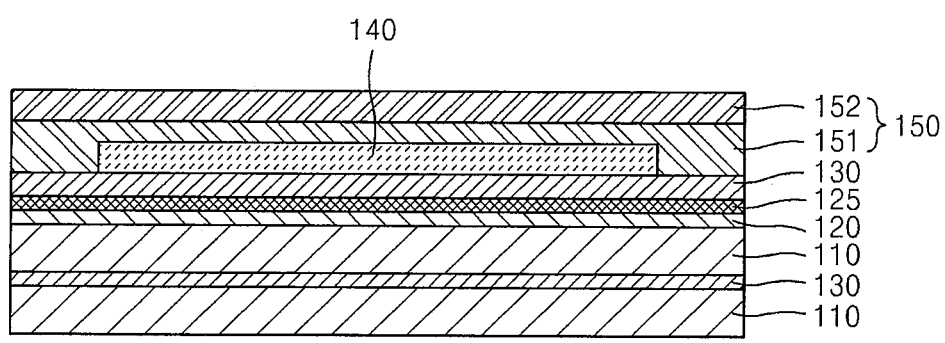
Figure 9:
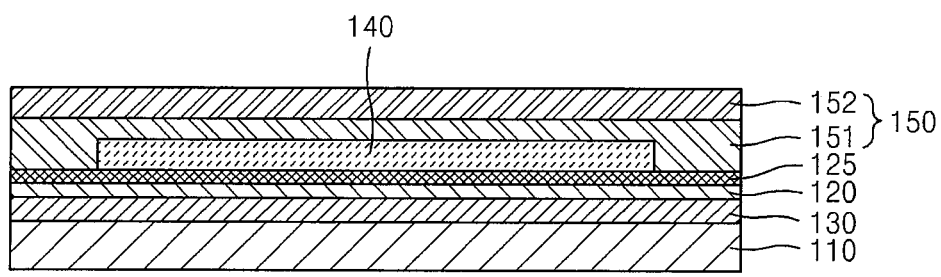
Figure 10:
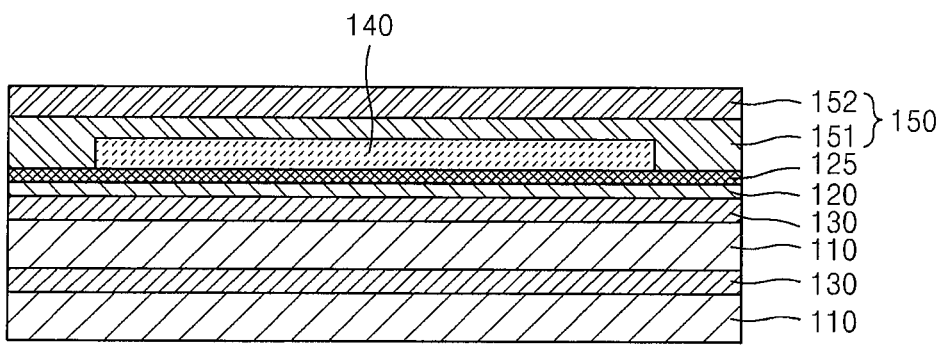

As shown in FIG. 6, in the structure in which the plurality of flexible substrates 110 and the plurality of barrier layers 130 are alternately disposed, the porous layer 120 may be formed between the barrier layer 130 closest to the display portion 140 and the display portion 140.

Meanwhile, the porous layer 120 is disposed between the flexible substrate 110 and the display portion 140 in the above-described embodiments. As shown in FIGS. 7 through 10, an aluminum oxide (AlOx) layer 125 may be further formed. That is, the porous layer 120 formed of the LiF material acts to prevent gas from permeating, but the emission layer of the display portion 140 may also be highly vulnerable to moisture. Thus, the AlOx layer 125 having excellent water proof ability may be further formed, thereby substantially preventing both gas and moisture from permeating.

As described above, according to the flexible organic light-emitting display apparatus of the above-described embodiments, and the method of manufacturing the flexible organic light-emitting display apparatus, a porous layer is used (e.g., utilized) to enhance a function of preventing permeation of gas, and thus, damage of a display portion may be substantially reduced, thereby substantially improving lifetime and reliability of a product.

It should be understood by a person having ordinary skill in the art that the embodiments described herein should be considered in a descriptive sense only and not for purposes of limitation. Descriptions of features or aspects within each embodiment should be considered as available for other similar features or aspects in other embodiments.

While aspects of the embodiments of the present invention have been described with reference to the figures, it will be understood by those of ordinary skill in the art that various modifications in form and detail may be made therein, without departing from the spirit and scope of the present invention as defined by the following claims, and their equivalents.

What is claimed is:

1. A flexible organic light-emitting display apparatus comprising:
    a flexible substrate;
    a barrier layer on the flexible substrate;
    a display portion on the barrier layer;
    an encapsulation layer covering the display portion; and
    a porous layer comprising a LiF material between the flexible substrate and the display portion,
    wherein the porous layer comprising the LiF material is between the barrier layer and the display portion.

2. The flexible organic light-emitting display apparatus of claim 1, wherein the flexible substrate comprises a plurality of flexible substrates and the barrier layer comprises a plurality of barrier layers, the plurality of flexible substrates and the plurality of barrier layers being alternately stacked, and
    wherein the porous layer is between a first flexible substrate of the plurality of flexible substrates and a first barrier layer of the plurality of barrier layers, the first flexible substrate being the closest to the display portion from among the plurality of flexible substrates and the first barrier layer being the closest to the display portion from among the plurality of barrier layers.

3. The flexible organic light-emitting display apparatus of claim 1, wherein the flexible substrate comprises a plurality of flexible substrates and the barrier layer comprises a plurality of barrier layers, the plurality of flexible substrates and the plurality of barrier layers being alternately stacked, and
    wherein the porous layer is between a first barrier layer closest to the display portion from among the plurality of barrier layers and the display portion.

4. The flexible organic light-emitting display apparatus of claim 1, further comprising an AlOx layer between the flexible substrate and the display portion.

5. A method of manufacturing a flexible organic light-emitting display apparatus, the method comprising:
    forming a flexible substrate on a carrier substrate;

forming a barrier layer on the flexible substrate;
forming a display portion on the barrier layer;
covering the display portion with an encapsulation layer; and
forming a porous layer comprising a LiF material between the flexible substrate and the display portion,
wherein the forming of the porous layer comprises forming the porous layer comprising the LiF material between the barrier layer and the display portion.

6. The method of claim 5, wherein the flexible substrate comprises a plurality of flexible substrates and the barrier layer comprises a plurality of barrier layers, the plurality of flexible substrate and the plurality of barrier layers being alternately stacked, and
wherein the porous layer is formed between a first flexible substrate of the plurality of flexible substrates and a first barrier layer of the plurality of barrier layers, the first flexible substrate being closest to the display portion from among the plurality of flexible substrates and the first barrier layer being closest to the display portion from among the plurality of barrier layers.

7. The method of claim 5, wherein the flexible substrate comprises a plurality of flexible substrates and the barrier layer comprises a plurality of barrier layers, the plurality of flexible substrates and the plurality of barrier layers being alternately stacked, and
wherein the porous layer is formed between a first barrier layer closest to the display portion from among the plurality of barrier layers and the display portion.

8. The method of claim 5, further comprising forming an AlOx layer between the flexible substrate and the display portion.

* * * * *